United States Patent [19]
Breneman et al.

[11] Patent Number: 5,414,399
[45] Date of Patent: May 9, 1995

[54] OPEN ACCESS SUPERCONDUCTING MRI MAGNET HAVING AN APPARATUS FOR REDUCING MAGNETIC HYSTERESIS IN SUPERCONDUCTING MRI SYSTEMS

[75] Inventors: Bruce C. Breneman; Raymond E. Sarwinski, both of San Diego; Yen-Hwa L. Hsu, Solana Beach, all of Calif.

[73] Assignee: Applied Superconetics, Inc., San Diego, Calif.

[21] Appl. No.: 812,080

[22] Filed: Dec. 19, 1991

[51] Int. Cl.⁶ .................. H01F 7/20; G01R 33/28
[52] U.S. Cl. .................... 335/301; 335/216; 324/318
[58] Field of Search ............... 335/296–306, 335/216; 324/318–320; 128/653.2, 653.5

[56] References Cited

U.S. PATENT DOCUMENTS

| | | | |
|---|---|---|---|
| 2,777,099 | 1/1957 | Foss | 317/158 |
| 3,018,422 | 1/1962 | Seaton | 317/201 |
| 3,223,897 | 12/1965 | Sullivan | 317/158 |
| 3,417,356 | 12/1968 | Tschopp | 335/298 |
| 3,924,211 | 12/1975 | Ioffe et al. | 335/284 |
| 4,093,912 | 6/1978 | Double et al. | 324/0.5 |
| 4,122,386 | 10/1978 | Tomita et al. | 324/0.5 |
| 4,445,102 | 4/1984 | Thorn et al. | 335/297 |
| 4,498,048 | 2/1985 | Lee et al. | 324/307 |
| 4,656,449 | 4/1987 | Mallard et al. | 335/297 |
| 4,672,346 | 6/1987 | Miyamoto et al. | 335/296 |
| 4,766,378 | 8/1988 | Danby | 324/307 |
| 4,980,641 | 12/1990 | Breneman et al. | 324/318 |
| 5,095,271 | 3/1992 | Ohkawa | 324/307 |
| 5,144,241 | 9/1992 | Oppelt et al. | 324/318 |
| 5,153,546 | 10/1992 | Laskais | 335/216 |
| 5,166,619 | 11/1992 | Ries | 324/318 |
| 5,207,224 | 5/1993 | Dickinson et al. | 128/653.5 |

FOREIGN PATENT DOCUMENTS 0208815  8/1989  Japan .................. 335/301

*Primary Examiner*—Leo P. Picard
*Assistant Examiner*—Ramon M. Barrera
*Attorney, Agent, or Firm*—Nydegger & Associates

[57] ABSTRACT

A MRI superconducting magnet having an open access frame with spaced parallel end plates, a superconducting coil assembly associated with each end plate, and gradient coils associated with each end plate includes an apparatus for minimizing hysteresis. The apparatus for minimizing hysteresis comprises a layer of nonferromagnetic conducting material interposed between the gradient coils and end plates. The interposed layer carries eddy currents induced by time varying magnetic fields produced by the gradient coils, thereby minimizing AC eddy current hysteresis from the end plates. The layer preferably has a thickness of at least one skin depth at the frequency associated with the time varying magnetic field. In another embodiment, each end plate has a plurality of slits formed therein for eliminating eddy currents in the end plates.

8 Claims, 2 Drawing Sheets

OPEN ACCESS SUPERCONDUCTING MRI MAGNET HAVING AN APPARATUS FOR REDUCING MAGNETIC HYSTERESIS IN SUPERCONDUCTING MRI SYSTEMS

TECHNICAL FIELD

This invention relates to medical devices and more particularly to magnetic resonance imaging (MRI) and to an open access superconducting MRI magnet having an apparatus for reducing magnetic hysteresis.

BACKGROUND OF THE INVENTION

In medical diagnosis, nuclear magnetic resonance (NMR) or magnetic resonance imaging (MRI) requires the production of a very strong static primary magnetic field for passage through a patient's body. A gradient magnetic field varying with time is superimposed on the primary field. Additionally, the patient is exposed to RF electromagnetic waves that are varied in time and in particular patterns. Under the influence of the magnetic and RF waves, nuclear spin distributions of atomic nuclei can be observed. This technique permits soft tissue and organs of the body to be examined for abnormalities such as tumors.

In MRI, the magnetic field must typically be a strong field on the order of about one kilogauss or more. Fields in excess of ten kilogauss (one Tesla) are sometimes required. Additionally, the field must be uniform, with non-uniformities of no more than one hundred (100) ppm. In addition, this uniformity must encompass a large portion of the patient's body, preferably with a diametral spherical volume (DSV) on the order of about 0.3 to 0.5 meters.

In the past these strong magnetic fields have been generated using permanent magnets, resistive magnets or superconducting magnets. Permanent magnets are typically the least expensive, require minimal site preparation, and are low cost to maintain because they require no liquid cryogens. Permanent magnets however, have limited field strength, temporal instabilities, are very heavy, and are costly at field strengths above 0.20 Tesla. Resistive magnets are also relatively inexpensive but require an elaborate and costly power and water supply. In addition the strength of resistive magnets is limited, large unwanted fringe fields are often generated, and temporal instabilities exist. Superconducting solenoidal magnets have the advantage of a strong field with high uniformity and good temporal stability. Superconducting solenoidal magnets, however, are expensive to construct and maintain and require elaborate cryogenic support structures. In the construction of medical MRI magnets, two different configurations or embodiments are generally in use. One type of structure is known in the art as an open access structure. Such a structure typically includes opposite parallel magnetic pole faces mounted on opposite parallel support plates. At least one and usually four support columns support the support plates and provide a return path for magnetic flux. Such an open structure is favored by patients because it is open and accessible from four sides. With such a structure, the magnetic flux lines pass generally orthogonally to the longitudinal (i.e head to toe) axis of the patient.

Another type of MRI magnet, rather than being constructed with opposite magnetic pole faces or as an open access structure, is similar to a large conventional solenoid. The solenoid structure is generally cylindrical in shape and is helically wound with electrically conducting wire. An electric current conducted through the wire produces lines of flux that run through a central opening of the cylinder and generally coincident with a longitudinal axis of the patient. Such an enclosed solenoid structure is known to give some patients a claustrophobic reaction. In addition, with such an enclosed structure there is no access for additional medical equipment and personnel for performing techniques such as interventional radiology.

Different types of magnet systems have been proposed for use with each of these structures. In the past, open access structures have typically been constructed with permanent magnets attached to the opposite pole faces. U.S. Pat. No. 4,943,774 to Breneman et al. for instance, discloses such an open access MRI structure that utilizes permanent magnets. The supporting structure is fabricated of a ferromagnetic material such as high quality structural steel.

The enclosed solenoid type structures may be formed with superconducting magnets. Such superconducting magnets must be cooled to a temperature close to absolute zero ($-273°$ C.) in order for the wiring to lose resistance to the flow of electric current. Relatively small diameter wires can thus carry large currents and create high magnetic fields. The superconducting wires are typically wrapped around the outer periphery of the cylindrical structure enclosed in a cryostatic vessel. Such an enclosed solenoid type structure may employ a pair of main superconducting coils and one or more auxiliary coils.

With either an open access magnet or a solenoid type magnet it is necessary to provide a uniform and homogeneous magnetic field in the (DSV) formed in the patient receiving area (i.e all lines of flux need to be substantially parallel to one another). One cause of a reduction in the uniformity of the magnetic field in the (DSV) is the production of localized linear gradients by the gradient coils used to produce the gradient magnetic field. In general the gradient coils produce local linear gradients in the x,y, and z directions within the (DSV) to ultimately provide spatial identification within the (DSV). The gradient coils are parallel, and are typically located a few centimeters from the large flat ferromagnetic pole faces utilized in an open access MRI magnet.

Unfortunately, when these gradient coils are pulsed during the utilization of the MRI system, the pole faces of the MRI device become additionally magnetized so that a substantial remnant gradient in the x,y, or z directions exists. Whenever a closed electrical path is exposed to a time varying magnetic field, an electrical eddy current is introduced into the path. These eddy currents generally have a relatively short time constant and act in a way to oppose the changing magnetic field. It is known that eddy currents flowing in ferromagnetic materials can cause magnetic hysteresis. Thus, such remnant gradients add unwanted gradients to the field and degrade the homogeneity of the magnetic field in the (DSV) and further impair image quality. Furthermore it is well known that minimizing eddy current signature, i.e. reducing the time constant and amplitude associated with the transient response, results in beneficial performance of an MRI magnet.

U.S. Pat. No. 4,980,641 to Breneman et al. is directed to a method and apparatus of reducing such hysteresis in an open access MRI magnet that utilizes permanent magnets. In this patent it is disclosed that by providing a shielding layer of nonferromagnetic conducting material on the pole faces, eddy currents are transferred from the pole face to the nonferromagnetic layer, thus minimizing any induced hysteresis. Conducting nonferromagnetic materials include aluminum (Al) or copper (Cu) plates. This patent further discloses that radial slits can be formed on the pole faces to provide a reduced path length for the eddy currents. Using the shielding layer or a slitted pole face structure, unwanted eddy current effects can be minimized so that the time constant is shortened considerably, on the order of one millisecond or less. Moreover, the amplitude of the eddy current, voltage and current signature are reduced to a very small value thus not introducing unwanted remnant gradients into the MRI system.

In light of the shortcomings of permanent magnet systems and of the closed and restrictive structure of conventional superconducting MRI magnets the present invention is directed to an open access MRI magnet constructed with superconducting magnets to generate a strong magnetic field. Such an open access MRI magnet maintains all of the advantages of the superconducting magnet (i.e. strong magnetic field, good temporal stability) and is formed with a patient receiving area accessible from several sides by additional medical personnel and equipment. In addition the superconducting MRI magnet of the invention includes an apparatus for reducing magnetic hysteresis. Accordingly, it is an object of the present invention to provide an open access superconducting MRI magnet having an apparatus for minimizing hysteresis induced by the pulsed gradient coils. It is a further object of the present invention to provide a superconducting MRI magnet for achieving a highly uniform magnetic field. It is yet another object of the present invention to provide an open access superconducting MRI magnet having an apparatus for minimizing hysteresis that is accessible for additional medical equipment and personnel for performing medical techniques such as interventional radiology.

SUMMARY OF THE INVENTION

In accordance with the present invention a superconducting MRI magnet having an apparatus for minimizing hysteresis is provided. Such a superconducting MRI magnet includes one or more superconducting coil assemblies for generating a magnetic field about a vertical polar axis that passes through a patient receiving area. The superconducting coil assemblies are mounted on an open access frame that includes a pair of opposed spaced end plates for supporting the superconducting coil assemblies and providing a return path for the flow of flux, and support posts connecting the end plates. Rose shims associated with each end plate are used to shape the magnetic flux field in the patient receiving area. A gradient coil is associated with each superconducting coil assembly mounted adjacent to an end plate and within the inner diameter of the superconducting coils.

For minimizing hysteresis and to carry eddy currents induced by time varying magnetic fields produced by the gradient coils a layer of nonferromagnetic conducting material is interposed between the end plate and gradient coil within the rose shim associated with each end plate. The layer has a thickness of at least one skin depth at the frequency associated with the time varying magnetic field. The layer is preferably contiguous with the end plates of the open access frame. The nonferromagnetic conducting materials for the layer include copper and aluminum. The layer functions to provide an alternate path for eddy currents thus minimizing hysteresis caused by eddy currents in the end plates.

In another preferred embodiment of the present invention, each end plate has a plurality of radially oriented slits formed in a circular area bounded by an inside diameter of the rose shim. The slits extend from the inside diameter of the rose shim to a point preferably within the smallest diameter of the associated gradient coil. The slits function to reduce the path of eddy currents such that, the amplitude or voltage of the eddy currents is reduced.

An open access superconducting MRI magnet may be constructed with both a layer of conducting material to provide a path for eddy currents and with a slit structure for reducing the eddy current paths. Alternately each embodiment may be utilized separately.

Other objects, advantages, and capabilities of the present invention will become more apparent as the description proceeds.

DESCRIPTION OF PREFERRED EMBODIMENTS

Figure 1:
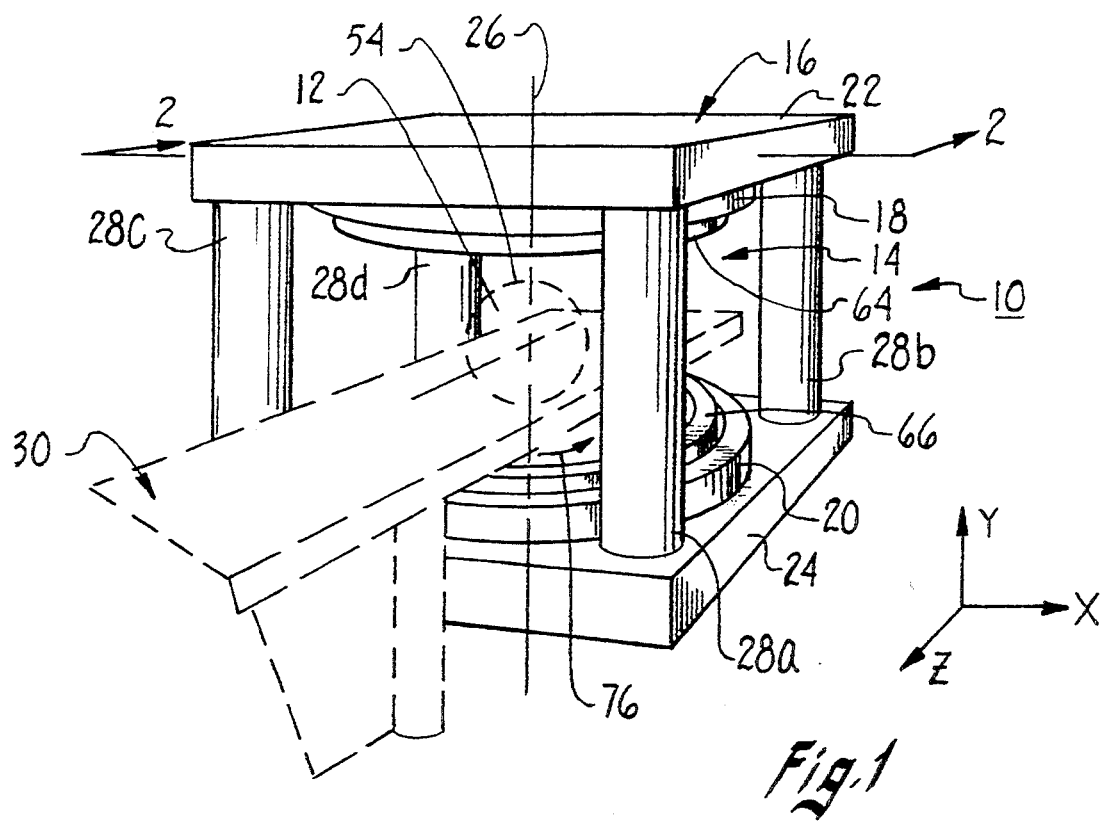
FIG. 1 is a perspective view of a four post open access superconducting MRI magnet having an apparatus for minimizing hysteresis constructed in accordance with the invention.
Figure 2:
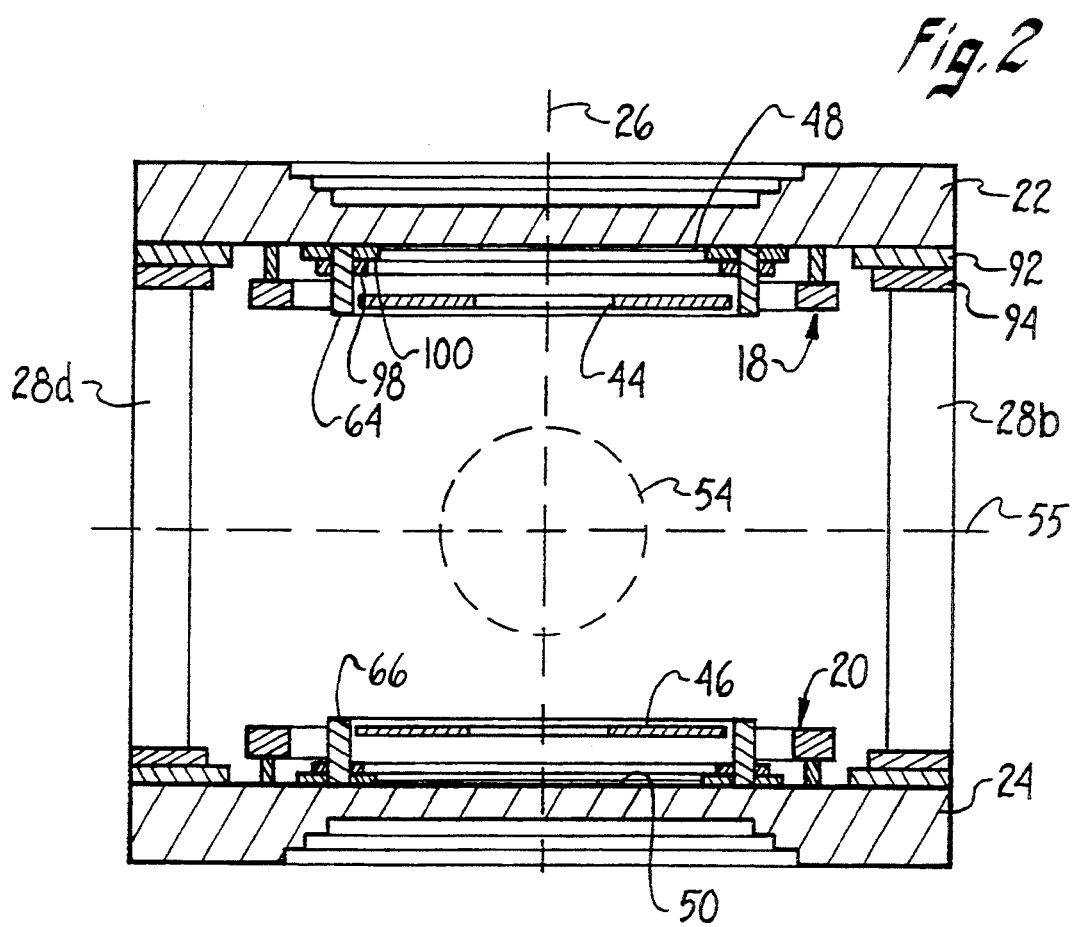
FIG. 2 is a schematic view partially in cross section taken along section line 2—2 of FIG. 1.

Referring now to FIGS. 1 and 2 an open access superconducting MRI magnet 10 having an apparatus 14 for reducing magnetic hysteresis constructed in accordance with the invention is shown. The superconducting MRI magnet 10 includes an open access frame 16 for supporting an upper superconducting coil assembly 18 and a lower superconducting coil assembly 20.

The open access frame 16 is formed of a ferromagnetic material that can be readily magnetized (i.e. magnetically soft). A preferred material for the frame 16 is low carbon steel. The open access frame 16 includes an upper end plate 22 and a lower end plate 24 for supporting the upper superconducting coil assembly 18 and lower superconducting coil assembly 20 respectively and for directing a magnetic flux field produced by the superconducting coil assemblies 18, 20. The upper end plate 22 and lower end plate 24 may each have a generally rectangular or square outer peripheral configuration. The upper end plate 22 and lower end plate 24 are formed with flat inner surfaces parallel to one another and generally orthogonal to a vertical polar axis 26 of a magnetic flux field produced by the superconducting coil assemblies 18, 20. The magnetic flux field passes through the middle of the open access frame 16 and through a patient receiving area 12. An outer surface of the end plates 22, 24 may be stopped or recessed for weight reduction.

The open access frame 16 also includes four support posts 28a–d fixedly attached to the upper end plate 22 and lower end plate 24 respectively. The support posts 28a-d are generally cylindrical in shape and are aligned in a generally square pattern generally parallel to the vertical polar axis 26. The support posts 28a-d are spaced far enough apart, from one another, to permit patient access from each of the four sides of the support frame 16. As an example, and as shown in fathom in FIG. 1, a patient support means 30 may be placed between any two support posts (i.e. 28c-d) for supporting a patient in a reclining position between the superconducting coil assemblies 18, 20. In addition this open access structure allows access to the patient for additional medical personnel and equipment and allows procedures such as interventional radiology to be performed.

The support posts 28a-d in addition to supporting the end plates 22,24 also provide a return path for magnetic flux generated by the superconducting coil assemblies 18,20. As such and as shown in FIG. 2, the end plates 22, 24 may be formed with a stepped outer surface construction in order to efficiently channel a return flow of flux without substantial magnetic flux loss. Additionally, as shown in FIG. 2, support posts 28a-d, may be connected to the upper end plate 22 or lower end plate 24 using transition plates 92, 94 similar to those disclosed in U.S. Pat. No. 4,943,774 to Breneman et al.

Figure 3:
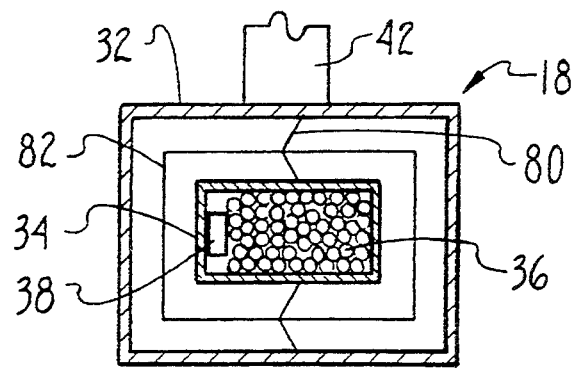
FIG. 3 is an enlarged portion of FIG. 2 showing a schematic cross section through a superconducting coil assembly in detail.

With reference to FIG. 3, each superconducting coil assembly 18,20 includes a toroidal, vacuum-tight insulated cryostat vessel 32 formed from a non-magnetic material, a liquid helium container 34 mounted within the cryostat vessel 32, and one or more coils of superconducting wire 36 mounted within the liquid helium container 34. In addition a persistent switch 38 is electrically coupled to the superconducting wire 36. The superconducting coil assemblies 18, 20 may also include one or more temperature shields 82. The temperature shields 82 as well as the liquid helium container 34 may be mounted on hangers 80 similar to those disclosed in U.S. Pat. No. 4,622,824 to R. L. Creedon which is incorporated herein by reference.

Each continuous coil of superconducting wire 36 is helically wound within the toroidal helium container 34. The superconducting wire 36 may be formed of any material that when cooled to below a superconducting transition temperature has essentially no resistance to current flow. As an example, a coil of superconducting wire 36 may be formed of copper having niobium titanium filaments within the wire. Upon cooling to a temperature of close to absolute zero such a material becomes superconducting. Alternately, other superconducting materials including those classified as high temperature or low temperature superconductors may be utilized.

The coil of superconducting wire 36 is formed about a longitudinal axis generally coincident to the vertical polar axis 26. Additionally each coil of superconducting wire 36 lies in a plane generally parallel to the plane of the inner surfaces of the upper end plate 22 and lower end plate 24 and generally perpendicular to the vertical polar axis 26. In addition, each coil of superconducting wire 36 is equidistance to a medial axis 55 located exactly midway between the upper end plate 22 and lower end plate 24.

Referring back again to FIG. 2, energizing the coil of superconducting wire 36 on the upper and lower superconducting coil assemblies 18, 20 generates a magnetic flux field with lines of flux that emanate generally parallel to the vertical polar axis 26, and generally orthogonally to the plane of the upper and lower end plates 22, 24. A return path for the flux is provided by the upper and lower end plates 22, 24 and by the support columns 28a-d. The magnetic flux field produced by the superconducting wires 36 must be shaped to provide a substantially uniform field in a diametral spherical volume (DSV) 54. The (DSV) 54 is centered along the vertical polar axis 26 and the medial axis 55 and is preferably about 0.3 to 0.5 meters in size.

For generating a magnetic field having lines of magnetic flux that extend through the (DSV) generally parallel to the vertical polar axis 26, and parallel to one another, the magnetic flux lines must be shaped. Accordingly a magnetic flux shaping means includes, an upper rose shim 64 and a lower rose shim 66 which are fixedly attached to the upper end plate 22 and lower end plate 24 respectively. The rose shims 64, 66 may be fabricated of a ferromagnetic material.

The open access MRI superconducting magnet also includes a pair of gradient coils 44, 46 operatively associated with the upper end plate 22 and lower end plate 24 respectively. The gradient coils 44, 46 produce localized linear magnetic field gradients in the x, y, and z direction as shown by arrows x, y, and z in FIG. 1. The gradient coils 44,46 are parallel to and within a few centimeters of the inner surface of the end plates 22 and. 24 respectively.

In an illustrative embodiment, the apparatus 14 for reducing hysteresis comprises a layer 48 formed on the inner surface of the upper end plate 22 of the open access frame 16 and a layer 50 formed on the inner surface lower end plate 24 of the open access frame 16. The layers 48, 50 are nonferromagnetic conducting materials, preferably aluminum or copper. The layers 48, 50 of nonferromagnetic conducting material are preferably contiguous with the inner surface of the end plates 22, 24 and spaced apart from the gradient coils 44, 46. In addition, the layers 48, 50 of nonferromagnetic conducting material are inset into the rose shims 64, 66 and have an outer peripheral configuration which corresponds to the inner diameter of the rose shims 64,66. The mounting of the layers 48, 50 of nonferromagnetic conducting material with respect to the end plates 22, 24, the gradient coils 44, 46 and the rose shims 64, 66 can be better appreciated with reference to FIG. 4.

Figure 4:
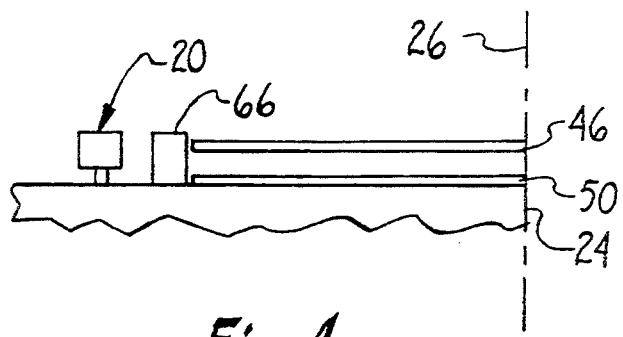
FIG. 4 is an enlarged schematic view of a portion of FIG. 2 with parts removed showing a protective layer formed in accordance with the invention.

In FIG. 4, there is shown the lower end plate 24, the layer 50 of nonferromagnetic conducting material positioned thereon, and the gradient coil 46 superposed above the end plate 24. The discussion respecting the lower end plate 24 with reference to FIG. 4, applies equally well to the upper end plate 22.

In operation of the MRI device, eddy currents are generated by the pulsed gradient coils 44, 46. These eddy currents are minimized in the end plates 22, 24 by the layers 48, 50 of nonferromagnetic conducting material. The eddy current instead flows in the nonferromagnetic layers 48, 50 and not in the ferromagnetic end plate 22, 24. Since layers 48, 50 is a nonferromagnetic material, the eddy currents induced in the conducting layers 48, 50 thus minimize any induced hysteresis in the end plates 22, 24.

It is desirable that the layers 48, 50 be of a thickness which does not add appreciably to the cost of manufacture of the MRI device, nor interfere with its operation, yet be sufficient to have its intended effect in accordance with the present invention. It has been found that a sufficient thickness is that of approximately one or more skin depth thicknesses. The skin depth thickness is proportional to the inverse square root of the frequency associated with the time varying magnetic flux field of the gradient coils 44, 46 which is inducing the eddy currents in the layers 48, 50. The skin depth, or depth of penetration, is also a characteristic of the material. A nonferromagnetic conducting material such as aluminum or copper should be utilized.

For copper material, for example, at sixty (60) Hz, the skin depth is $8.5 \times 10^{-3}$ meters. At one (1) MHz, skin depth is $6.6 \times 10^{-5}$ meters. At thirty (30) GHz, skin depth is $3.8 \times 10^{-7}$ meters. The appropriate skin depth thickness of the layers 48, 50 can thus be readily determined based on the material chosen and the frequencies associated with operation of the MRI device in order to realize the benefits of the present invention. It should be kept in mind that the gradient coils 44, 46 are typically within a few centimeters of the end plate 22, 24, so that the thickness of a layer 48, 50 must be sufficiently thin to allow its placement therebetween.

Figure 5:
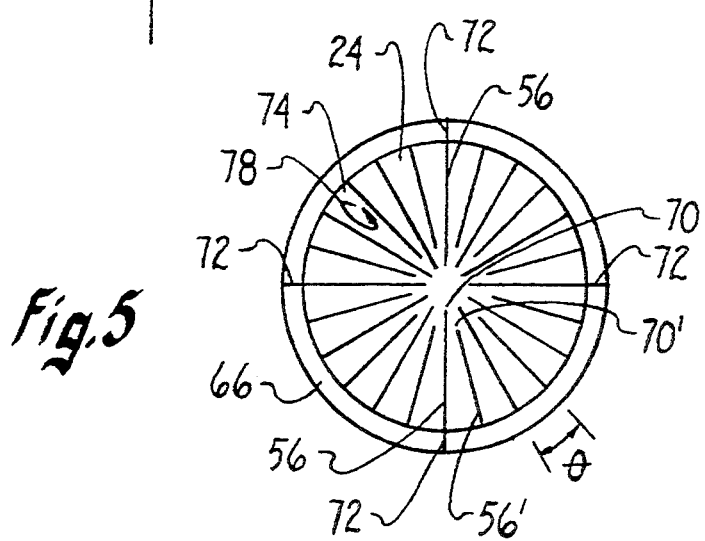
FIG. 5 is a plan view of an alternate embodiment of the invention.

Referring now to FIG. 5, an alternate preferred embodiment of the apparatus for reducing hysteresis 14 of the present invention is shown. The alternate embodiment simply stated, includes a plurality of radial slits 56 formed on the end plates 22, 24. The slits 56 function to reduce the path of eddy currents. The radial slits 56 may be used in addition to or in place of the layers 48,50 of nonferromagnetic conducting material.

The plurality of radial slits 56 are formed within the inside diameter of the rose shims 64, 66. The slits radiate inward from the inside diameter of the rose shims 64, 66 to an inner diameter 70. The inner diameter 70 is preferably located within the smallest diameter of the x,y, or z gradient coils contained within the gradient coil 46. The radial slits 56 may extend into the end plate 22 or 24 to a depth of several centimeters. In addition, to prevent degradation of the structural strength of the end plates 22,24, the slits alternate with shorter slits 56' which end at alternating points 70' near the center of the circular surface enclosed by the rose shim 66. In addition, some of the slits 72 (i.e. four) may extend completely through the rose shim 66 to divide the rose shim 66 into a plurality of separate segments.

The slits may also be filled with electrical insulation material to further prevent the conduction of current between the separate portions 74 of the end plates 22, 24 divided by the slits 56. The effect of the slits 56 is to minimize the eddy current from being induced throughout the larger diameter portions of the end plate 24 as shown by arrow 76 in FIG. 1, and instead allow much smaller induced eddy currents as shown by arrow 78 in smaller portions 74 of the end plate 24. This helps to minimize the eddy current effect. It is theorized that the plurality of slits 56 in effect prevents a large AC induced eddy current from being set up, and therefore reduces the hysteresis effect to the point that there are insignificant affects on the uniformity of the magnetic field in the (DSV)

In the embodiment shown in FIG. 5, the slits 56 are preferably placed at an angle Θ, equidistant from one another. In the embodiment shown there are twenty-four (24) slits 56 placed at fifteen degrees (15°) from one another. In this alternate embodiment a layer 48, 50 is not required, but could be utilized if so desired. In this embodiment, the slits 56 may be less than one-sixteenth (1/16) of an inch wide, as long as they are of sufficient width to prevent flow of current in its path around the end plate 22. Moreover, it will be appreciated by the skilled artisan that the positioning of the slits 56 in the upper end plate 22 should be symmetrical to those in the lower end plate 24.

While the particular method and apparatus of reducing magnetic hysteresis as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. In a MRI superconducting magnet having an open access frame with spaced parallel end plates, one being an upper end plate and the other being a lower end plate and a patient receiving area therebetween, and a gradient coil spaced apart from and parallel to an end plate for producing time varying magnetic fields at a frequency, an apparatus for minimizing hysteresis comprising:
  a gradient coil mounted to the upper end plate and a gradient coil mounted to the lower end plate;
  a cylindrical rose shim attached to each end plate;
  a layer of nonferromagnetic conducting material formed within the rose shim interposed between the end plate and the gradient coil and within a diameter of a superconducting coil assembly associated with the end plate to carry eddy currents induced by the time varying magnetic fields produced by the gradient coil; and
  a plurality of slits on each end plate radiating inward from an inside diameter of the rose shim to a point within a smallest diameter of the gradient coil.

2. The apparatus as claimed in claim 1 and wherein: the slits are filled with an insulating material.

3. The apparatus as claimed in claim 1 and wherein: the layer is formed of copper.

4. The apparatus as claimed in claim 1 and wherein: the layer is formed of aluminum.

5. An open access MRI magnet comprising:
  (a) a substantially open ferromagnetic frame including an upper end plate and a lower end plate and at least two support posts for supporting the end plates with a patient receiving area between the end plates accessible for additional medical equipment and personnel;
  (b) a superconducting coil assembly attached to the upper and lower end plates respectively with each superconducting coil assembly including a toroidal vacuum tight cryostat vessel, insulation and one or more temperature shields mounted within the cryostat vessel, a helium container mounted within the cryostat vessel connected to a source of liquid helium, and a coil of superconducting wire mounted in the helium container for cooling to a temperature below a superconducting transition temperature with the superconducting wire disposed along a coil plane generally parallel to the upper and lower end plates and formed of a material that has substantially zero resistance to electrical flow below a superconducting transition temperature;
  (c) a control means for the superconducting coil assemblies including a power source for initiating a flow of current through each superconducting coil and a persistent switch for maintaining a flow of current through the superconducting coils such that a magnetic flux field is generated along a vertical polar axis in the patient receiving area with a return path provided by the frame;

(d) magnetic flux shaping means for shaping the magnetic field to provide a substantially uniform magnetic flux field in a (DSV) located in the patient receiving area and including rose shims mounted to the upper and lower end plates; and (e) a plurality of radial slits in each end plate located within the rose shims with the positioning of the slits on each end plate substantially symmetrical to one another for reducing an eddy current path in each end plate.

6. The open access magnet as defined in claim 5 and wherein:
the upper and lower end plates are generally rectangular and are supported by four support posts such that the patient receiving area is accessible on four sides.

7. The open access magnet as defined in claim 5 and wherein:
insulating material is placed into the slits.

8. The open access magnet as defined in claim 5 and wherein:
the radial slits extend through the rose shims dividing the rose shims into separate segments.

* * * * *